United States Patent [19]

Ibar

[11] 4,349,886
[45] Sep. 14, 1982

[54] DEVICE FOR MODIFYING OR CONTROLLING THE SHAPE OF AN ELECTRICAL OUTPUT SIGNAL

[76] Inventor: Jean-Pierre Ibar, Avenue de la Division Leclerc, Ballainvilliers (Essonne), France

[21] Appl. No.: 132,846

[22] Filed: Mar. 24, 1980

[30] Foreign Application Priority Data

Mar. 27, 1979 [FR] France ............................... 79 07678
Feb. 1, 1980 [FR] France ............................... 80 02296

[51] Int. Cl.$^3$ ........................ G01R 15/10; G01K 7/14
[52] U.S. Cl. .................................. 364/573; 364/571; 324/132
[58] Field of Search ............... 364/573, 571, 557, 851, 364/852; 324/105, 132; 73/361, 362 AR, 765, 766, 1 F; 328/184

[56] References Cited

U.S. PATENT DOCUMENTS

| | | | |
|---|---|---|---|
| 3,700,865 | 10/1972 | Ley | 364/573 |
| 3,939,459 | 2/1976 | Hoopes | 364/573 |
| 3,953,718 | 4/1976 | Cooke | 364/573 |
| 4,102,199 | 7/1978 | Tsipouras | 364/557 |
| 4,132,116 | 1/1979 | Zeeb | 364/573 |
| 4,149,120 | 4/1979 | Richter | 364/573 |
| 4,161,880 | 7/1979 | Prosky | 364/557 |
| 4,179,745 | 12/1979 | Wuertele | 364/573 |
| 4,193,300 | 3/1980 | Peter | 364/573 |
| 4,241,303 | 12/1980 | Thompson | 73/362 AR |

FOREIGN PATENT DOCUMENTS

2041532 3/1971 Fed. Rep. of Germany ...... 324/132
1493940 11/1977 United Kingdom ................ 324/132

*Primary Examiner*—Errol A. Krass
*Assistant Examiner*—Gary Chin
*Attorney, Agent, or Firm*—Wolf, Greenfield & Sacks

[57] ABSTRACT

The invention relates to a device for modifying and controlling the shape of an output signal. It depends on the development of a parameter (temperature, pressure, stress . . . etc.) supplied by a transducer, and comprises an electrical circuit with two branches each receiving the input signal ($V_1$) to be transformed, one of the branches including a linear circuit effecting a linear transformation ($A_0 + A_1 V_1$) of the input signal ($V_1$) and the other branch including on the one hand a multiple linear circuit to effect a multiple linear transformation ($A_2 + V_1$), ($A_3 + V_1$), ($A_4 + V_1$ . . . etc.) giving the intermediate signals ($X = A_2 + V_1$) and ($Z = A_4 + V_1$ . . . etc.), and on the other hand a combining circuit receiving the intermediate signals (X, Y, Z) to combine them by multiplication ($X^\alpha$, $Y^\beta$, $Z^\gamma$ . . . etc.) the designations, $\alpha$, $\beta$, and $\gamma$ are integers which can assume the values 0, +1, or −1. At least one of these numbers ($\alpha, \beta, \gamma$ . . . etc.) is negative and an adder circuit receives the linear signal ($A_0 + A_2 V_1$) from the first branch and the combination signal (X, Y, Z) from the second branch adds and provides the transformed signal ($V_3$). The device is useful for linearizing output signals of resistance thermometers, pressure gauge etc.

14 Claims, 5 Drawing Figures

Figure_1

DEVICE FOR MODIFYING OR CONTROLLING THE SHAPE OF AN ELECTRICAL OUTPUT SIGNAL

FIELD OF THE INVENTION

The present invention relates to a device for modifying or controlling the shape of a non-linear electrical output signal supplied by a transducer such as a thermocouple, a stress gauge, a semi-conductor, a resistance theremometer, etc . . . to linearize this output signal.

The invention may also be used to create non-linear output signals, starting from a pre-determined signal.

DESCRIPTION OF THE PRIOR ART

In numerous industrial control applications, it is necessary to transform non-linear output signals from transducer into a signal which is connected by a linear function to a parameter, such as a temperature, a stress, pressure, a movement etc.

At present, these signals are transformed to linear signals, using one of the four methods described below:

First Method

The characteristic curve of the signal is assimilated to a set of straight segments, each corresponding to a narrow range. Analog circuits for applying this method are composed by a series of diodes or of transistors which must be correctly adapted. Moreover, these components are unstable over a period of time, and as a function of temperature, which is manifested by output signals, which are of poor accuracy. It is also possible to linearize a digital signal, by using an approximation by segments, but in this case, it is necessary to use a large number of constants to reduce the error to the minimum.

Second Method

The non-linear characteristic curve is processed by taking the ratio of two voltages, raised to a power which is not a whole number, namely:

$$V_{output} = (V_{input}/V_{ref})^m$$

$V_{output}$:output voltage signal
$V_{input}$:input voltage signal
$V_{ref}$:reference voltage signal This linearizing method can be done by means of an analog multiplier, but the electrical accuracy does not exceed 0.5% and the stability of the output signal $V_{output}$ is very sensitive to even small variations of the coefficient m. In addition, this method only permits linearizing of simple curves. Finally, this method is long to put into practice to be useful in digital circuits.

Third Method

According to this method, a development in series of the characteristic curve is formed:

$$V_{output} = A_0 + A_1 V_{in}^2 + A_3 V_{in}^3 + \ldots \quad (V_{in} = \text{input voltage signal}).$$

The coefficients of this development in series ($A_0$, $A_1$, $A_2$ . . . ) have been calculated in the particular case of thermocouples and of platinum resistance thermometer by the NBS Organization (National Bureau of Standards). The analog circuit which ensures the linearization of this development in series is unstable, since it includes multipliers mounted in cascade, and any small error whatever of the initial multiplier stage is manifested by considerable errors, in the terms of high power, for example, the term of power 3 ($V_{input}$ 3). When this method is applied in digital technique, a very accurate multiplication is necessary which is manifested by very long programs on the micro-computer.

Fourth Method

A reference table is used to ensure the linearization by digital method: for each non-linear input magnitude, the linearized output signal is recorded in a memory. The drawback of this method is that it requires very considerable amounts of memory storage space. In addition, this method is relatively long (in the best cases, it only permits six measurements per second), which is restricting for continuous analog servo controls.

It is an object of the present invention to provide a device for modifying and controlling the shape of an electrical output signal, with a minimum number of active electrical components, and a minimum number of constants, using an electrical component circuit, to linearize accurately, the non-linear input signal, with minimum drift in temperature and in time.

It is also an object of the invention to provide a linearizing circuit applicable to various transducers with a non-linear response.

It is also an object of the invention to provide a circuit giving a non-linear output signal, starting from any input signal, for example to control external devices, such as servo-motors or heating systems.

Other objects and advantages of the invention will become apparent from the description which follows.

GENERAL DESCRIPTION OF THE INVENTION

Accordingly, the invention relates to a device for modifying or controlling the shape of an electrical output signal, this device being characterised in that it is composed of an electrical circuit with two branches each receiving the input signal $V_1$ to be transformed, one of the branches including a linear circuit effecting a linear transformation ($A_0 + A_1 V_1$) of the input signal $V_1$ and the other branch includes, on the one hand, a multiple linear circuit to effect a multiple linear transformation ($A_2 + V_1$), ($A_3 + V_1$), ($A_4 + V_1$ . . . etc.) giving the intermediate signals ($X = A_2 + V_1$), ($Y = A_3 + V_1$) and ($Z = A_4 + V_1$ . . . etc.) and, on the other hand, a combining circuit receiving the intermediate signals X, Y, Z to combine them by multiplication ($X^\alpha$, $Y^\beta$, $Z^\gamma$ . . . etc.), $\alpha$, $\beta$, $\gamma$ . . . etc. being integers, at least one of the integers being negative and an adder circuit receiving the linear signal ($A_0 + A_1 V_1$) from the first branch and the combined signal ($X^\alpha$, $Y^\beta$, $Z^\gamma$) from the second branch to add them and provide the transformed signal $V_3$.

Thus, the combination signal and the linear signal coupled to one another to give a single output signal.

This coupling is done, for example, by the addition of the two signals to one another to obtain the sum.

An algebric sum could also be envisaged (that is to say an addition or a subtraction). Coupling with weighting of the two terms, may also be envisaged.

According to an improvement, a simpler device, is adapted to various applications.

Thus, in the case of a formula of the form $A_0 + A_1 V_1 + X^\alpha$, $Y^\beta$, $Z^\gamma$ of which $\gamma = 0$; $\beta = -1$ and $\alpha = +1$, the circuit, according to the invention, is characterized in that the combining circuit giving the signal $X^\alpha$, $Y^\beta$, from the signals X and Y is an analog/digital converter of which the input of signals receives the signal $X^\alpha$ and the input of the reference voltage receives the signal $Y^\beta (\beta = -1, \alpha = +1)$.

According to another important simplification, in the case of a relationship of the form $V_3 = A_o + A_1 V_1 + X^\alpha$, $Y^\beta$, $Z^\gamma$ in which:

$A_o$ = any given value
$A_1 = 0$
$\gamma = 0$
$\alpha = 1$
$\beta = -1$

The output signal is that provided by the analog/digital convertor if a digital signal is suitable for the downstream circuit. In the contrary case, the circuit includes at the output a digital/analog converter.

This embodiment can be used, for example, to modify the output signal provided by a thermocouple and give a signal enabling the application of a vibromolding method to be controlled, as this is described for example, in Applicant's co-pending application Ser. No. 287,673, filed July 28, 1981 which is a continuation of an earlier filed application.

BRIEF DESCRIPTION OF THE DRAWINGS

The present invention will be described in more detail, by means of the accompanying drawings, in which.

DESCRIPTION OF PREFERRED EMBODIMENTS

According to the invention, a transducer with a non-linear response, such as, for example, the output voltage of a thermocouple which varies with the temperature or again the variable resistance of a semi-conductor stress gauge varying, as a function of the stress, is converted by calculation, into a linear relationship, using adjustment statistical analysis by computer to obtain the characteristic constants, according to the equation 1 set out below.

$$V_3 = A_o + A_1 V_1 + \frac{(A_2 + V_1)(A_3 + V_1)() \ldots}{(A_4 + V_1)() \ldots} \quad (1)$$

$$V_3 = A_o + A_1 V_1 + X^\alpha Y^\beta Z^{65} \ldots \text{etc} \quad (1')$$

$\alpha + \beta + \gamma + \ldots \text{etc.} = 1$ $\alpha, \beta, \gamma \ldots$ algebric numbers of which at least one is a negative number.

$$V_3 = \quad (2)$$

$$R_7 \left[ \frac{V_2}{R_5} + \frac{V_1}{R_6} + \frac{\left(\frac{V_5}{R_1} + \frac{V_1}{R_A}\right)\left(\frac{V_5}{R_2} + \frac{V_1}{R_B}\right)}{\frac{V_5}{R_3} + \frac{V_1}{R_C}} \right]$$

$$V_3 = \frac{R_7 V_2}{R_5} \frac{R_7 V_2}{R_6} + \quad (2')$$

$$R_7 \frac{\left(\frac{V_5}{R_1} + \frac{V_1}{R_A}\right)\left(\frac{V_5}{R_2} + \frac{V_i}{R_B}\right)}{\frac{V_5}{R_3} + \frac{V_1}{R_C}}$$

$$V_3 = A_o + \frac{A_2 \cdot A_3}{A_4 - V_1} \quad (3)$$

$$V_5 = R_{13}\left[ -\frac{V_4}{R_{12}} + \frac{(i_1)(i_2)}{i_3 + \frac{0.002 \times RTD}{R_8}} \right] \quad (4)$$

In this equation 1,
$V_3$: is the linearized output voltage
$A_o \ldots A_4$ are linearizing constants
$V_1$ is the input signal to be treated.
This equation is in the form (1') given above.

Figure 1:
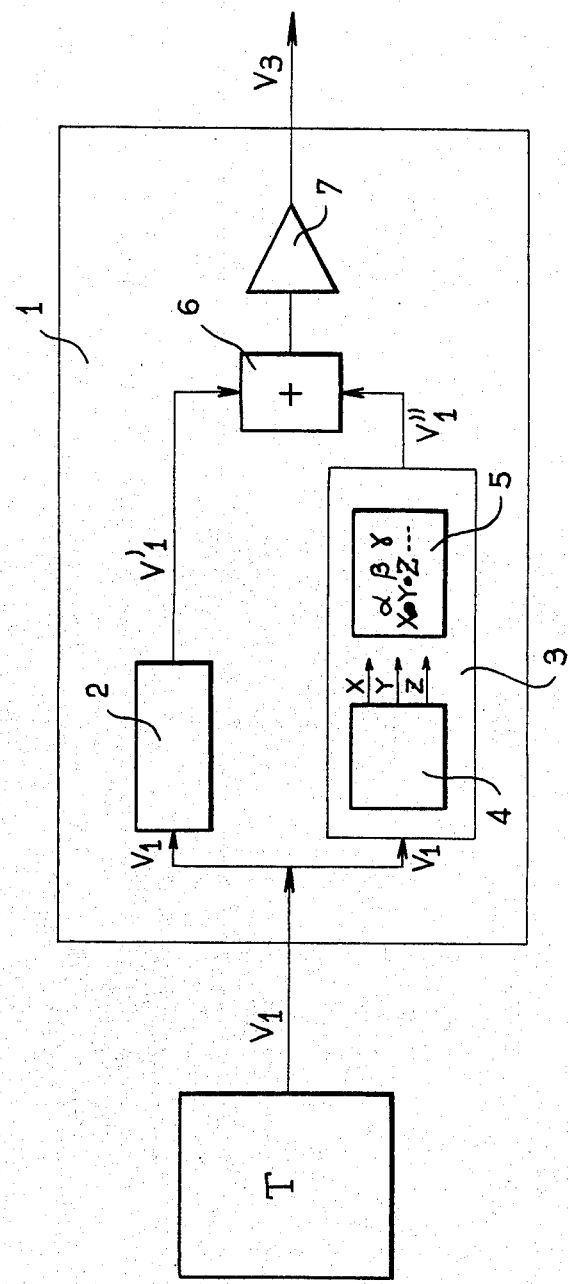
FIG. 1 shows a general diagram of a device according to the invention.

According to FIG. 1, a transducer T provides an output signal $V_1$ such as the voltage signal which is desired to connect by a linear relationship to the parameter detected by the transducer.

This signal $V_1$ is applied to the processing and control device 1, according to the invention. Device 1 is composed of two branches 2, 3 each receiving the signal $V_1$.

The branch 2 includes a linear circuit transforming the signal $V_1$ by linear transformation into a signal:

$$V'_1 = A_o + A_1 V_1$$

The branch 3 is composed of a multiple linear circuit 4 supplying a combining circuit 5. The circuit 4 gives at the output several signals X, Y, Z connected to the signal $V_1$ by the linear relationship:

$$X = A_2 + V_1; Y = A_3 + V_1; Z = A_4 + V_1;$$

The combining circuit 5 combines the intermediate signals X, Y, Z to give the signal:

$$V''_1 = X^\alpha \cdot Y^\beta \cdot Z^\gamma$$

($\alpha, \beta, \gamma$, being algebric numbers, of which at least one is negative, and of which the sum is equal to 1).

The device 1 also includes an adder 6 receiving the two signals $V'_1$ and $V''_1$ to add them; the sum signal is if necessary amplified by the operational amplifier to give the output signal $V_3$.

According to the invention, and as a function of the transducer or sensor T, it may be necessary to amplify or more generally to treat the output signal proper of the transducer T to obtain a voltage signal $V_1$ usable by the device 1.

The analog multiplier having itself its own errors due to its electrical construction, it is possible to modify the resistances of the circuits 2 and 4 to correct these errors which do not result from the linearization formula starting from values of resistances initially obtained by a statistical adjustment calculation and then by adjusting these values.

The circuit giving the signal $V_3$ from the signal $V_1$ may be a digital circuit or an analog circuit. Two examples of analog circuits will be explained by means of FIGS. 2 and 3.

In the case of a circuit of the digital type, it is necessary at the input, to convert the signal $V_1$ into a digital signal, then to process this signal to form digital signals $V'_1$, X, Y Z, $X^\alpha$, $Y^\beta$, $Z^\gamma$ then to add them and transform the sum signal into an analog signal.

Figure 2:
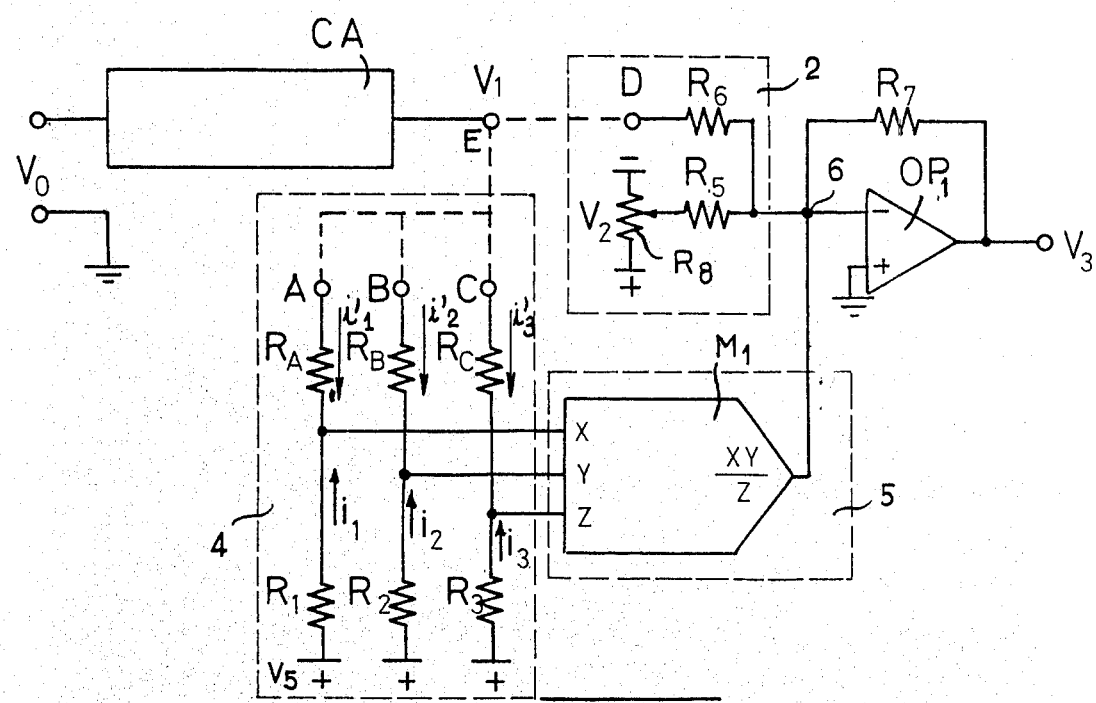
FIG. 2 is a general diagram of the device according to the invention, and shows a first analog embodiment of the device according to the invention.

According to the example of the analog circuit shown in FIG. 2, the input signal $V_o$ formed by a transducer not shown is first corrected by means of a compensating circuit CA, necessary if the transducer supplying the signal $V_o$ is a thermocouple or a semi-conductor stress gauge. For this, a cold junction compensating circuit is used. Such compensation corresponds to a known technique which will not be described. The compensating signal $V_1$ which is amplified by the processing amplifier CA constitutes the input voltage $V_1$. This voltage $V_1$ is applied to the input E of the circuit 4 which, in the case of FIG. 2 is constituted by a network of resistors RA, RB, RC, $R_1$, $R_2$, $R_3$ as well as to the input of circuit 2 formed from $R_5$, $R_6$, resistors, the resistor $R_7$ is the feedback resistor of the operational amplifier $OP_1$. The choice of the terminals A, B, C, D is done as a function of the type of transducer, that is to say according to the form of the response curve of the transducer.

The voltage signals applied to the points A, B, C are transformed into current signals by precision resistors RA, RB, RC. These current signals are added respectively to the intensities $i_1$, $i_2$, $i_3$. The choice of sign of the intensities depends on the shape of the non-linear characteristics of the transducer: it is not necessary for all the input currents to be positive.

The linear circuit 2 is composed of a resistor $R_6$ transforming the input voltage $V_1$ applied to the terminal D into a current equal to the ratio ($V_1/R_6$).

The circuit 2 also includes a constant current source formed by a potentiometer or an adjusting resistor $R_8$ supplied by a constant d.c. voltage. The output voltage $V_2$ of the potentiometer is applied to the resistor $R_5$ where the current flowing through resistor $R_5$ is: ($V_2/R_5$).

The circuit 2 supplies the sum of the two currents namely:

$$V'_1 = \frac{V_2}{R_5} + \frac{V_1}{R_6}$$

to the adder 6 which is constituted by a simple junction. The signal $V'_1$ is clearly of the form:

$$V'_1 = A_o + A_1 V_1$$

The multiple linear circuit 4 transforms the voltage signal $V_1$ which is applied at its input and from there to the terminals A, B, C into current signals in the resistors $R_A$, $R_B$, $R_C$; namely $i'_1 = (V_1/R_A)$; $i'_2 = (V_1/R_B)$; $i'_3 = (V_1/R_C)$.

The intensities $i'_1$, $i'_2$, $i'_3$ are added to the constant intensities $i_1$, $i_2$, $i_3$ supplied by the resistors $R_1$, $R_2$, $R_3$ supplied by the voltage $V_5$.

$$i_1 = \frac{V_5}{R_1} \quad i_2 = \frac{V_5}{R_2} \quad i_3 = \frac{V_5}{R_3}$$

In this way the intensity signals are obtained:

$$X_i = i_1 + i'_1 = \frac{V_5}{R_1} + \frac{V_1}{R_A}$$

$$Y_i = i_2 + i'_2 = \frac{V_5}{R_2} + \frac{V_1}{R_B}$$

$$Z_i = i_3 + i'_3 = \frac{V_5}{R_3} + \frac{V_1}{R_C}$$

In these formulas, the only variable is $V_1$; the other terms being constant

To within a multiplying coefficient $R_A$, $R_B$, $R_C$, the signals X, Y, Z, linear as a function of $V_1$ are of the form:

$$X = A_2 + V_1 = X_i R_A$$

$$Y = A_3 + V_1 = Y_i R_B$$

$$Z = A_4 + V_1 = Z_i R_C$$

The combining circuit 5 is constituted by a multiplier $M_1$ which effects the combination of the magnitudes X, Y, Z according to the general formula $X^\alpha \cdot Y^\beta \cdot Z^\gamma$ in which:

$$\alpha = +1$$

$$\beta = +1$$

$$\gamma = -1$$

The formula then becomes:

$$\frac{X \cdot Y}{Z} \text{ or again } V''' = \frac{(A_2 + V_1)(A_3 + V_1)}{(A_4 + V_1)}$$

Signals $V'_1$ and $V''_1$ are applied to the adder 6 constituted by a junction. In this way the signal obtained is:

$$V'_1 + V''_1 = (A_o + A_1 V_1) + \frac{(A_2 + V_1)(A_3 + V_1)}{(A_4 + V_1)}$$

or again:

$$V'_1 + V''_1 =$$

$$\frac{V_2}{R_5} + \frac{V_1}{R_6} + \frac{\left(\frac{V_5}{R_1} + \frac{V_1}{R_A}\right)\left(\frac{V_5}{R_2} + \frac{V_1}{R_B}\right)}{\frac{V_5}{R_3} + \frac{V_1}{R_C}}$$

This signal is applied to the operational amplifier $OP_1$ which gives the output the signal $V_3$ according to the formula indicated above.

In general, by selecting the connections or by cutting one or other of the connections of the points A, B, C, D, the formula is adapted to the response curve of the transducer.

General equation (2) does not assume that all the inputs are positive. In addition, various modifications, in the materials, in the operations, in the details, in the distribution of the components, etc . . . may be made without departing from the scope of the invention.

Figure 3:
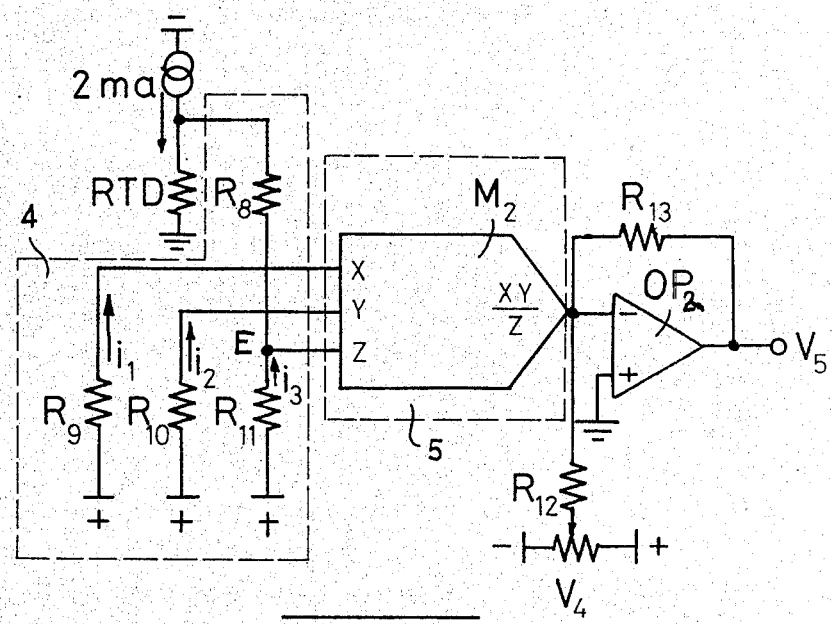
FIG. 3 is a second simplified analog embodiment of the device according to the invention applied to platinum resistance thermometers (RTD)

FIG. 3 shows simplified embodiment of the invention applied to a platinum resistance thermometer. This embodiment corresponds to a simplification of the general structure of FIG. 1 or of FIG. 2. In fact, in this diagram, the connections to the points A, B, D of diagram of FIG. 2 are eliminated, leaving only the connection of the point C.

The general equation (2) described above is transformed under these conditions, since the opening of the junctions A, B, D corresponds to the resistors $R_A$, $R_B$, $R_6$ of infinite value; equation (1) is obtained which in the digital application gives the equation 4 (see above).

This circuit gives a mathematical accuracy according to the equation (4) of the order of 0.1% for temperatures between $-120°$ C. and $+880°$ C. for a platinum resistance thermometer; the total errors of the electronic circuits can be kept to less than 0.15% if precision components are used. The operational amplifier mounted as in FIG. 3 works under the most accurate conditions of operation for such an integrated circuit.

By way of example, in the circuit of FIG. 3, the accuracy is greater than 0.1% for a semi-conductor stress gauge, whose resistance varies, non-linearly, as well as as a function of various manufacturing batches. The circuit of FIG. 3 enables batches of stress gauges with different characteristics to be linearized by modifying the resistor $R_{11}$ (FIG. 3) or $R_3$ (FIG. 2). The electrical circuit of FIG. 3 can be applied to thermocouples for certain ranges of temperature. The output signal supplied by a thermocouple is the sum of the Fem created by two different alloys. The resulting response curve is for this reason, often complex, with points of inflexion as well as with curves, both concave and convex. The circuit of FIG. 3 enables such a curve to be linearized with an accuracy of the order of 1%; this accuracy being however distinctly improved, if one uses the more general assembly of FIG. 2. The principal portion of the sum output signal is derived from the linear amplification of the voltage $V_1$ by the branch connected to the terminal D, and the current $i_4$ created by the multiplier $M_1$ serves to correct the error due to the linear approximation. The equation 1 which corresponds to the circuit of FIG. 2, is sufficiently flexible to linearize thermocouples, of type K, T, R, S, B, J, W as well as the Nisil/Nicrosil thermocouple, with linearizing accuracies comprised between 0.05% and 0.2% according to the choice of the thermocouple and the range of temperature.

This embodiment can also be used to obtain a non-linear response serving for example for the control of heating devices and of motors. The mechanical inertia of a servomotor, and the thermal inertia of a heating system both necessitate a non-linear control to render the characteristics optimal. The use of the circuit of FIG. 2 enables the obtaining of an optimal, non-linear control signal $V_3$ by starting from an input voltage with a linear variation $V_1$. An application of such a device is the control of the increase/decrease in temperature of a oven controlled by a thermocouple. In this case, the output signal $V_o$ of the thermocouple is considered as a linear signal, and the control voltage $V_3$ is modified to produce the compensation. The choice of connections to A, B, C and D and the signs of the input currents at $M_1$ depend on the utilization.

Figure 4:
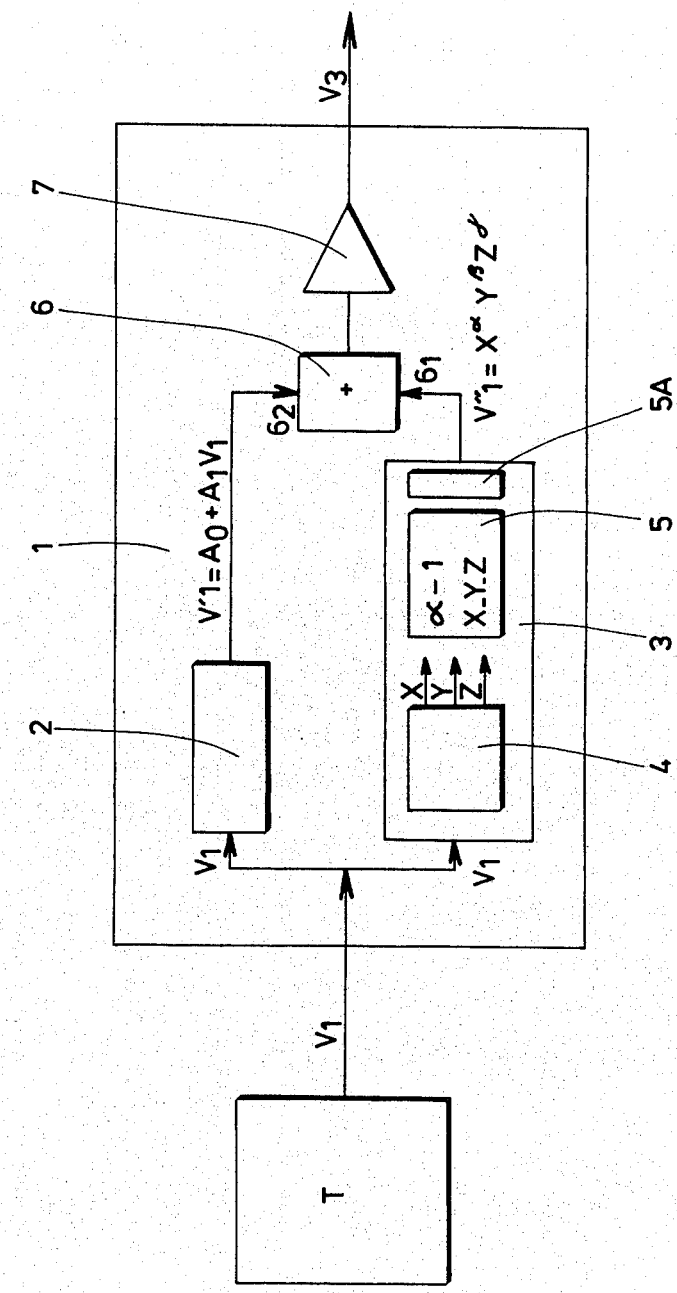
FIG. 4 is a diagram of a third simplified embodiment.
Figure 5:
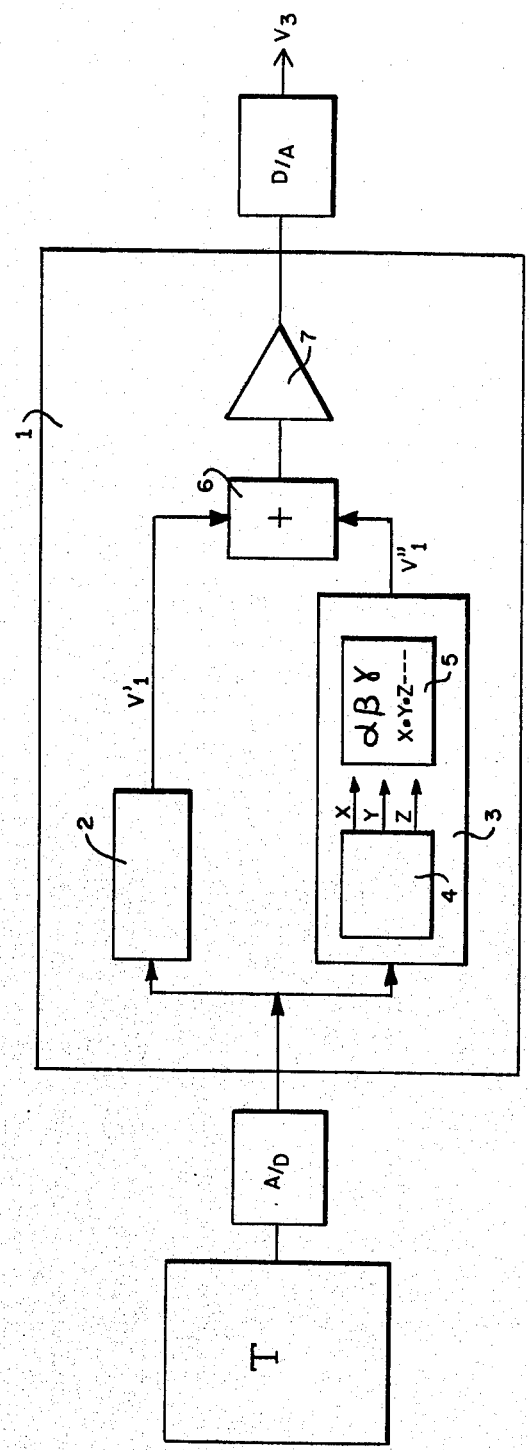
FIG. 5 is a diagram similar to the one shown in FIG. 1 but employing an analog-to-digital converter at the input and a digital-to-analog converter at the output of the system.

According to FIG. 4, a transducer T provides an output signal $V_1$ such as a voltage signal which is desired to connect by a linear relationship to the parameter detected by the transducer.

This signal $V_1$ is applied to the processing and control device 1, according to the invention. The device 1 is composed of two branches 2, 3 each receiving the signal $V_1$.

The branch 2 includes a linear circuit transforming the signal $V_1$ by linear transformation into a signal:

$$V'_1 = A_0 + A_1 V_1$$

The branch 3 is composed of a multiple linear circuit 4 supplying a combining circuit 5. The circuit 4 gives several signals X, Y, Z at the output connected to the signal $V_1$ by the linear relationship:

$$X = A_2 + V_1; Y = A_3 + V_1; Z = A_4 + V_1;$$

The combining circuit 5 combines the intermediate signals X, Y, Z to give the signal:

$$V''_1 X^\alpha . Y^\beta . Z^\gamma.$$

In the general case $\alpha, \beta, \gamma$ are algebric numbers equal to $0, +1, -1$, of which at least one is negative.

The device 1 also includes an adder 6 receiving the two signals $V'_1$ and $V''_1$ to combine them; the signal obtained is if necessary amplified by the operational amplifier to give the output signal $V_3$.

In the case of formula (1) for the coefficients:

$$\alpha = 1$$
$$\beta = -1$$
$$\gamma = 0$$

the simplified formula is as follows:

$$V_3 = A_o + A_1 V_1 + (X^\alpha / Y)$$

In this case, according to an additional feature of the invention, the combining circuit 5 is constituted by an analog/digital converter. This converter receives the signal $X^\alpha$ at its signal input and its reference voltage input receives the signal Y. At the output, the converter 5 gives the signal $X^\alpha$ in digital form. This signal is applied to the input of a digital/analog converter 5A whose output is applied to the input 61 of the adder of which the other input 62 receives the signal $V'_1 = A_o + A_1 V_1$.

The above described circuit is simplified further by the following conditions:

$A_o$ = any given value
$A_1 = 0$ $\alpha = 1$ $\beta = -1$ $\gamma = 0$ since the formula (1) is written as follows:

$$V_3 = (X/Y)$$

The output signal from the converter 5A is the signal $V_3$.

If the circuit receiving the signal $V_3$ can receive a digital signal, it is possible to apply to it directly the output signal from the converter 5.

As already indicated, although the application described above relates to a complete analog processing, it is also possible to carry out a digital processing, by first converting the voltage $V_1$ into a digital signal, then by processing this signal to carry out adequate additions, multiplications (exponent positive) and divisions (exponent negative). Then, again, the signal is transformed by a digital/analog conversion since it does not introduce an error derived from the electrical circuits, but it is longer and adapted only to slow readout or control response times.

In conclusion, the invention is also more rapid than the serial development techniques serving for digital linearization and requiring less constants than reference tables for an approximation by linear segments.

I claim:

1. Device for modifying and controlling the shape of an electrical output signal which is a function of a physical parameter supplied by a transducer, said device comprising an electrical circuit with at least two branches each receiving the input signal ($V_1$) to be transformed, one of the branches including a linear circuit effecting a linear transformation ($A_0 + A_1 V_1$) of the input signal ($V_1$), where $A_0$ and $A_1$ are constants, and the other branch including a multiple linear circuit to effect a multiple linear transformation of the same input signal ($V_1$) by generating the intermediate signals ($X = A_2 + V_1$), ($Y = A_3 + V_1$) and ($Z = A_4 + V_1$) where $A_2$, $A_3$, $A_4$ are constants, and a combining circuit receiving the intermediate signals (X, Y, Z ...) to combine them by multiplication or division in accordance with ($X^\alpha Y^\beta Z^\gamma \ldots$), where $\alpha, \beta$ and $\gamma$ are either $-1$, 0, or $+1$, at least one of the numbers ($\alpha, \beta, \gamma \ldots$) being negative, and an adder circuit receiving the linear signal ($A_0 + A_1 V_1$) from the first branch and the combination signal ($X^\alpha, Y^\beta, Z^\gamma \ldots$) from the second branch to add them and provide the transformed signal ($V_3$).

2. Device according to claim 1, wherein said two-branch circuits are digital circuits.

3. Device according to claim 1, wherein the two-branch circuits are analogue circuits and the exponents are $\alpha = +1, \beta = +1, \gamma = -1$.

4. Device according to claim 1, wherein the linear circuit and the multiple linear circuit are circuits comprising resistors.

5. Device according to claim 1, wherein the combining circuit is a multiplier circuit.

6. Device according to claim 1, wherein the combining circuit is a circuit receiving and processing current signals.

7. Device according to claim 6 wherein the combining circuit comprises a multiplier circuit which carries out the transformation (XY/Z).

8. Device according to claim 1, wherein in the case:

$\alpha = 1$ $\beta = -1$ $\gamma = 0$ the combining circuit is constituted by an analog/digital converter whose one input receives the signal (X) and the reference voltage input receives the signal (Y), the output of said analog/digital converter connected to one input of the adder whose other input receives the signal ($V'_1 = A_0 + A_1 V_1$).

9. Device according to claim 8, wherein, in the case $\alpha = 1$ and $A_0 =$ any given value:

$\beta = -1$ $\gamma = 0$ $A_1 = 0$ the output terminal of the said electrical circuit providing the signal ($V_3$) either in analog or digital form.

10. A device according to claim 1 wherein said combining circuit comprises an analog-to-digital converter.

11. A device according to claim 1 wherein the signal $V_1$ is a digital signal.

12. A device according to claim 1 wherein the signal $V_1$ is an analog signal.

13. A device according to claim 1 wherein the linear circuit and the multiple linear circuit are analog circuits.

14. A device according to claim 1 including analog-to-digital means for converting the input signal $V_1$ into a digital signal and digital-to-analog conversion means for converting the said transformed signal back to analog at the output of the device.

* * * * *